(12) United States Patent
Chen

(10) Patent No.: US 6,500,355 B1
(45) Date of Patent: Dec. 31, 2002

(54) WAFER CONDUCTIVE STRUCTURE FOR PREVENTING PLASMA DAMAGE

(75) Inventor: Chung-Chih Chen, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 222 days.

(21) Appl. No.: 09/715,416

(22) Filed: Nov. 16, 2000

(30) Foreign Application Priority Data

Oct. 26, 2000 (TW) ..................................... 89122536 A

(51) Int. Cl.⁷ .............................. H01L 21/00; B44C 1/22
(52) U.S. Cl. .............................. 216/67; 216/18; 216/39; 428/544; 428/548; 438/719; 438/720
(58) Field of Search .............................. 216/2, 13, 18, 216/39, 67; 428/544, 548, 551, 596, 615; 438/672, 675, 710, 719, 720, 723

(56) References Cited

U.S. PATENT DOCUMENTS 5,258,328 A * 11/1993 Sunada et al. ........... 438/737 X
5,759,919 A * 6/1998 Liu ........................ 438/719 X
6,225,207 B1 * 5/2001 Parikh .................... 438/738 X

* cited by examiner

Primary Examiner—William A. Powell
(74) Attorney, Agent, or Firm—Charles C. H. Wu; Wu & Chueng, LLP

(57) ABSTRACT

A conductive structure in a silicon wafer for preventing plasma damage. The wafer includes a plurality of dies and a plurality of scribe lines between the dies. The semiconductor substrate of this wafer further includes a plurality of patterned conductive layers. The conductive structure comprises of a plurality of ground wires and a plurality of contacts. The ground wires are distributed inside the scribe lines and are positioned at least in the uppermost conductive layer. The contacts are used for connecting the ground wires and the semiconductor substrate electrically. When other conductive layers other than the uppermost conductive layer also contain ground wire connections, the ground wires in different conductive layers are electrically connected by plugs.

20 Claims, 2 Drawing Sheets

WAFER CONDUCTIVE STRUCTURE FOR PREVENTING PLASMA DAMAGE

CROSS-REFERENCE TO RELATED APPLICATION

This application claims the priority benefit of Taiwan application serial no. 89122536, filed Oct. 26, 2000.

BACKGROUND OF THE INVENTION

1. Field of Invention

The present invention relates to a protective structure on a silicon wafer. More particularly, the present invention relates to a conductive structure on a silicon wafer for preventing plasma damage.

2. Description of Related Art

In integrated circuit (IC) manufacture, the dimensional requirement of each device are getting smaller while the aspect ratio of etching or gap filling is getting higher. Consequently, high-density plasma has to be used in dry etching or chemical vapor deposition (CVD) (for example, plasma-enhanced CVD or high-density plasma CVD). For example, plasma density has increased from a former value of $10^9 \sim 10^{10}/cm^3$ to a current value of about $10^{11} \sim 10^{12}/cm^3$.

However, as plasma density rises, any non-uniform charge distribution frequently can lead to arcing. Arcing is an electrical phenomena that results when electric charges jump from a region of high plasma density to a region of low plasma density through a silicon wafer so that electric potential in these regions are equalized. Since the electric potential and current density involved in each arcing process is very high, path inside the wafer through which the current runs may cause serious damages. Therefore, methods of preventing direct arcing through a wafer despite using high-density plasma in various processes are critical to success in semiconductor manufacturing.

SUMMARY OF THE INVENTION

Accordingly, one object of the present invention is to provide a conductive structure in a silicon wafer for preventing plasma damage. The wafer includes a plurality of dies and a plurality of scribe lines between the dies. The semiconductor substrate of this wafer also includes a plurality of conductive layers. The conductive structure comprises of a plurality of ground wires and a plurality of contacts. The ground wires are distributed inside the scribe lines and are positioned at least in the uppermost conductive layer. The contacts are used for connecting the ground wires and the semiconductor substrate electrically. When other conductive layers other than the uppermost conductive layer also contain ground wire connections, the ground wires in different conductive layers are electrically connected by a plurality of plugs.

This invention also provides a method of manufacturing a conductive structure capable of preventing plasma damage in a silicon wafer. First, a plurality of contacts electrically connected with a semiconductor substrate is formed in a plurality of scribe lines. The conductive layers on the scribe lines are patterned when conductive patterns re formed in the die section. Ultimately, ground wires that are electrically connected o the contacts are also formed. Furthermore, if a plurality of ground wire layers is required, the plugs that links with a previous ground wires are formed concurrently with the step of forming necessary plugs in the die section. Moreover, the next layer of ground wires is formed in the scribe lines when the next conductive layer is patterned inside the die section. The ground wires in the upper layer and the ground wires in the lower layer are electrically connected through the plugs.

The conductive structure on the wafer has several functions. When a plasma semiconductor process is carried out, the ground wires provide electrical paths for the flow of current so that uneven electrical charge distribution of the plasma can be equalized. In addition, the ground wire, the contact and the plug that links up the ground wires of different layers are electrically connected together with the semiconductor substrate so that the whole structure is effectively grounded. In other words, excess charges above the wafer can be channeled away through the semiconductor substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with he description, serve to explain the principles of the invention. In the drawings.

DESCRIPTION OF THE PREFERRED EMBODIMENTS

Figure 1:
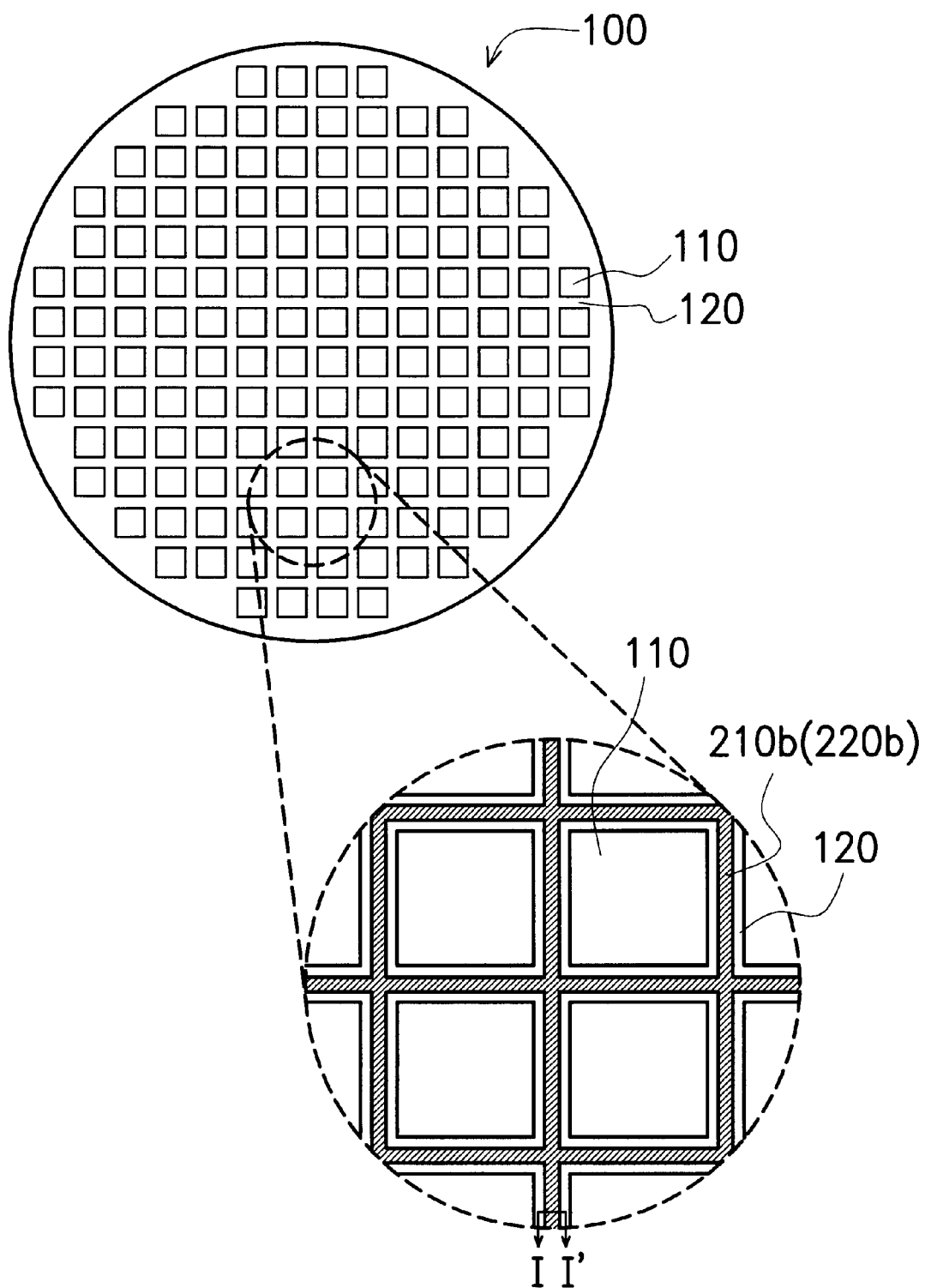
FIG. 1 is a top view of the dies, scribe lines and the ground wires on a silicon wafer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 3:
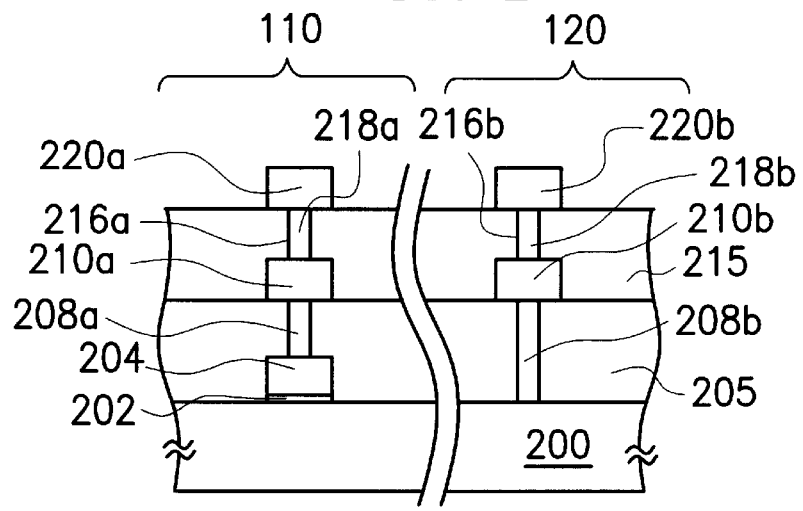

FIG. 1 is a top view of the dies, scribe lines and the ground wires on a silicon wafer according to one preferred embodiment of this invention. FIG. 3 is a schematic cross-sectional view of a portion of the silicon wafer shown in FIG. 1. In fact, the right side of FIG. 3 with a labeled 120 is a cross-sectional view along line I–I' of FIG. 1.

As shown in FIG. 1, the silicon wafer 100 has a plurality of dies 110 and a plurality of scribe lines 120 between the dies 110. Each scribe line 120 has a plurality of ground wires 210b and 220b (note that ground wires 210b and 220b are on a different layer, see the section below). The ground wires 210b and 220b surround each die 110. For better clarity, width of the ground wire 210b (220b) and the die 110/scribe line 120 are drawn with slight exaggeration.

As shown in FIG. 3, the ground wire 210b is the first layer of ground wire in the upper portion of the semiconductor substrate 200. The ground wire 210b is formed over the dielectric layer 205 above the semiconductor substrate 200. The dielectric layer 205 has a contact 208b that connects the ground wire 210b and the semiconductor substrate 200 electrically. The ground wire 220b is a second layer ground wire. The ground wire 220b is located over a dielectric layer 215 sitting on top of the dielectric layer 205. The ground wire 220b is electrically connected with the ground wire 210b by a plug 218b that passes through the dielectric layer 215. In other words, the ground wire 210b, the contact 208b and the semiconductor substrate 200 are electrically connected together via the plug 218b.

Figure 2:
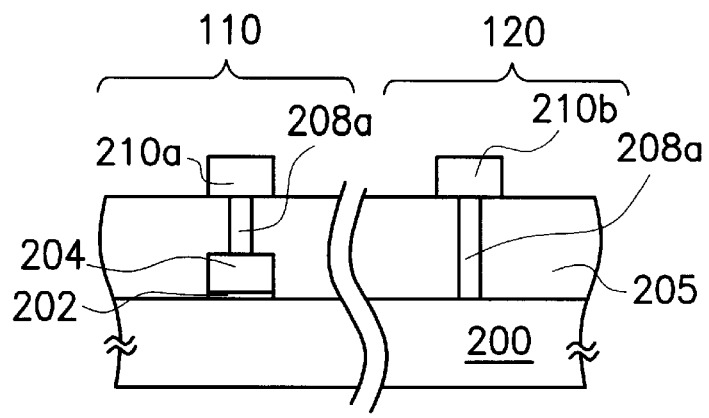
FIGS. 2 through 4 are schematic cross-sectional views showing the progression of steps for producing a conductive structure with a plurality of ground wire layers and corresponding structures in the dies of a silicon wafer according to this invention.
Figure 4:
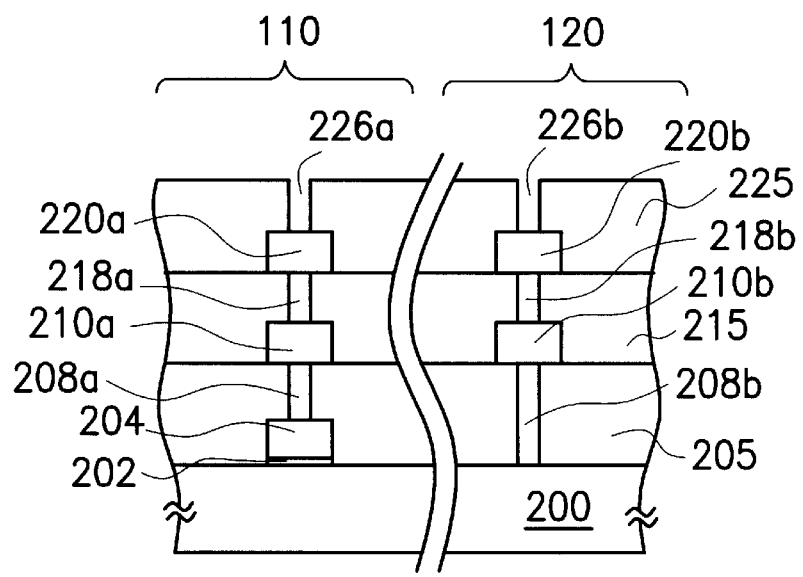

FIGS. 2 through 4 are schematic cross-sectional views showing the progression of steps for producing a conductive structure with a plurality of ground wire layers and corresponding structures in the dies of a silicon wafer according to this invention.

As shown in FIG. 2, a dielectric layer 205 is formed over a semiconductor substrate 200 inside a die 110 and scribe lines 120. A gate oxide layer 202 and a gate electrode 204 are sequentially formed over the semiconductor substrate 200 inside the die 110 section. The gate electrode 204 can be a polysilicon layer, for example. A dielectric layer 205 is formed over the semiconductor substrate 200. A contact 208a that electrically connects with the gate electrode 204 is formed in the dielectric layer 205 within the die 110. In the meantime, a contact 208b is also formed in the dielectric layer 205 within the scribe line 120. The contact 208b is electrically connected to the semiconductor substrate 200. A conductive layer (not shown in the figure) is formed over the semiconductor substrate 200. The conductive layer is next patterned to form a conductive wire 210a that connects electrically with the contact 208a within the die 110 section. In the meantime, a ground wire 210b that electrically connects with the contact 208b inside the scribe line 120 is also formed. Hence, the first ground wire layer is completed. The conductive layer forms a second conductive layer above the semiconductor substrate 200. In general, the conductive layer is in general a polysilicon or a polysilicon/silicide composite layer.

As shown in FIG. 3, a dielectric layer 215 is formed over the semiconductor substrate 200. A via hole 216a that exposes a portion of the conductive wire 210a is formed in the dielectric layer 215 inside the die 110. In the meantime, a via hole 216b that exposes a portion of the ground wire 210b is also formed in the dielectric layer 215 inside the scribe line 120. In the process of depositing dielectric material to form the dielectric layer 215 and the etching the dielectric layer 215 to form the via holes 216a/b, at least one of them involves performing a high-density plasma process. The deposition can be carried out, for example, by performing a plasma-enhanced chemical vapor deposition (PECVD) or a high-density plasma chemical vapor deposition (HDP-CVD). In the presence of the ground wire 210b (connects electrically with the substrate 200 through the contact 208b) above the dielectric layer 205 within the scribe line 120, non-uniform charge distribution in the plasma above the wafer can be equalized. The uneven charge distribution can be equalized by passing through various ground wires 210b scattered on the wafer 100 or through the ground wire 210b and the contact 208b and finally exit from the semiconductor substrate 200. Consequently, even if the high-density plasma has highly non-uniform charge distribution, arcing rarely occurs, thereby preventing serious damages to the devices within the wafer.

Similarly, as long as high-density plasma process is involved, a plurality of ground wires may also be patterned in the same manner inside the scribe line 120 when other upper conductive layers are needed within the die 110.

After forming the via holes 216a and 216b, conductive material is deposited into the holes to form plugs 218a and 218b respectively. The plug 218a is electrically connected with the ground wire 210a and the plug 218b is electrically connected with the ground wire 210b. A conductive wire 220a that connects electrically with the plug 218a is formed above the dielectric layer 215 within the die 110. In the meantime, a ground wire 220b that connects electrically with the plug 218b is formed above the dielectric layer 215 within the scribe line 120.

As shown in FIG. 4, a dielectric layer 225 is formed over the semiconductor substrate 200. A via hole 226a that exposes a portion of the conductive wire 220a is formed in the dielectric layer 225 within the die 10. At the same time, a via hole 226b that exposes a portion of the ground wire 220b is formed in the dielectric layer 225 within the scribe line 120. Here, ground wires 220b that connect electrically with the semiconductor substrate 200 are distributed all around the wafer above the dielectric layer 215 inside the scribe line 120. In the presence of these ground wires 220b, no arcing due to uneven charge distribution of the high-density plasma will occur. Hence, devices within the wafer will remain intact after conducting a high-density plasma chemical vapor deposition to form the dielectric layer 225 or a high-density plasma etching process to form the via holes 226a/b.

In addition, the invention can form one layer of ground wires or a multiple of ground wires depending on whether subsequent high-density plasma deposition or etching is required. The advantage of this invention is that the ground wires are distributed all across the wafer so that an uneven distribution of electric charges in plasma can be easily equalized. Moreover, various ground wires are electrically connected to the semiconductor substrate via contacts (with ground wires in different layer connected by additional plugs). Hence, excess electrical charges can easily exit from the semiconductor substrate. Ultimately, arcing in the presence of unevenly distributed high-density plasma will rarely occur, thereby preventing any damages to the devices within the wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A conductive structure for protecting a wafer against plasma damage, wherein the wafer has a plurality of dies and a plurality of scribe lines between the dies and the semiconductor substrate of the wafer has a plurality of conductive layers thereon, comprising:

a plurality of ground wires distributed within the scribe lines, wherein at least the uppermost conductive layer has ground wires, and when the other conductive layers besides the uppermost conductive layer also contains ground wires, the ground wires in different conductive layers are electrically connected by a plurality of plugs; and a plurality of contacts within the scribe lines, wherein the contacts serves to connect the ground wires with the semiconductor substrate electrically.

2. The conductive structure of claim 1, wherein each conductive layer that contains ground wires includes a metallic layer.

3. The conductive structure of claim 1, wherein the bottommost conductive layer that contains ground wires is the second layer counting from the semiconductor substrate.

4. The conductive structure of claim 1, wherein the bottommost conductive layer that contains ground wires includes a polysilicon/silicide composite layer.

5. The conductive structure of claim 1, wherein the bottommost conductive layer that contains ground wires includes a polysilicon layer.

6. The conductive structure of claim 1, wherein the ground wires in the same conductive layer are joined together to form a grid that surrounds the die.

7. A method of protecting a silicon wafer against plasma damages, wherein the wafer has a plurality of dies, a plurality of scribe lines between the dies and a semiconductor substrate thereon, comprising the steps of:

forming a plurality of patterned conductive layers above the semiconductor substrate, wherein at least the uppermost conductive layer has a plurality of ground wires and the ground wires are distributed in the scribe lines, the conductive layers are electrically connected to the semiconductor substrate through a plurality of contacts, and when the conductive layers besides the uppermost conductive layer also contain ground wires, the ground wires in different conductive layers are electrically connected by a plurality of plugs; and performing plasma processing such that the ground wires, the contacts and the plugs together protect the wafer against plasma damages.

8. The method of claim 7, wherein the step of performing plasma processing includes conducting plasma chemical vapor deposition.

9. The method of claim 8, wherein the step of performing plasma chemical vapor deposition includes conducting plasma-enhanced chemical vapor deposition (PECVD) or high-density plasma chemical vapor deposition (HDP-CVD).

10. The method of claim 7, wherein the step of performing plasma chemical vapor deposition includes forming a material layer over the semiconductor substrate and then conducting plasma etching.

11. The method of claim 7, wherein each conductive layer that contains ground ires includes a metallic layer.

12. The method of claim 7, wherein the bottommost conductive layer that contains ground wires is the second layer counting from the semiconductor substrate.

13. The method of claim 7, wherein the bottommost conductive layer that contains ground wires includes a polysilicon/silicide composite layer or a polysilicon layer.

14. The method of claim 7, wherein the ground wires in the same conductive layer are joined together to form a grid that surrounds the die.

15. A method of protecting a silicon wafer against plasma damages, wherein the wafer has a plurality of dies, a plurality of scribe lines between the dies, a semiconductor substrate, a patterned first conductive layer above the semiconductor substrate and a first dielectric layer above the first conductive layer, comprising the steps of:

forming a plurality of die contacts in the first dielectric layer such that the die contacts and the first conductive layer are electrically connected, and at the same time forming a plurality of ground contacts in the scribe lines such that the ground contacts at least pass through the first dielectric layer and connect electrically with the semiconductor substrate; and forming a patterned second conductive layer over the first dielectric layer, wherein the second conductive layer within the die and the die contacts are electrically connected, the second conductive layer within the scribe lines has a plurality of ground wires, the ground wires and the ground contacts are electrically connected and the ground wires and the semiconductor substrate are electrically connected via the ground contacts.

16. The method of claim 15, wherein after the step of forming the patterned second conductive layer, further includes the steps of:

forming a second dielectric layer over the semiconductor substrate;

forming a plurality of die plug in the second dielectric layer within the die region such that the die plugs and the second conductive layer are electrically connected, and at the same time forming a plurality of ground plugs in the second dielectric layer within the scribe lines such that the ground plugs and the ground wires are electrically connected;

forming third patterned conductive layer over the second dielectric layer, wherein the third conductive layer within the die region and the die plugs are electrically connected, the third conductive layer within the scribe lines includes a plurality of upper layer ground wires, and the upper ground wires and the ground plugs are electrically connected; and repeating the aforementioned steps if another conductive layer needs to form above subsequently formed conductive layer and that further plasma processing needs to be carried out after the conductive layer is formed.

17. The method of claim 15, wherein the first conductive layer that contains the ground wires is the first conductive layer above the semiconductor substrate and the first conductive layer includes a polysilicon layer.

18. The method of claim 15, wherein the second conductive layer is the second conductive layer counting from the semiconductor substrate.

19. The method of claim 15, wherein the second conductive layer includes a polysilicon layer or a polysilicon/silicide composite layer.

20. The method of claim 15, wherein the ground wires in the same conductive layer are joined together to form a grid that surrounds the die.

* * * * *